(12) United States Patent
Gossman et al.

(10) Patent No.: US 9,000,549 B2
(45) Date of Patent: Apr. 7, 2015

(54) SPATIALLY DISTRIBUTED CDS IN THIN FILM PHOTOVOLTAIC DEVICES AND THEIR METHODS OF MANUFACTURE

(71) Applicant: First Solar, Inc., Tempe, AZ (US)

(72) Inventors: Robert Dwayne Gossman, Aurora, CO (US); Scott Daniel Feldman-Peabody, Golden, CO (US); Bastiaan Arie Korevaar, Schenectady, NY (US)

(73) Assignee: First Solar, Inc., Tempe, AZ (US)

( * ) Notice: Subject to any disclaimer, the term of this patent is extended or adjusted under 35 U.S.C. 154(b) by 129 days.

(21) Appl. No.: 13/676,550

(22) Filed: Nov. 14, 2012

(65) Prior Publication Data

US 2014/0131826 A1    May 15, 2014

(51) Int. Cl.
*H01L 31/02* (2006.01)
*H01L 31/18* (2006.01)
*H01L 31/073* (2012.01)
*H01L 31/0352* (2006.01)

(52) U.S. Cl.
CPC ...... *H01L 31/073* (2013.01); *H01L 31/035218* (2013.01)

(58) Field of Classification Search
CPC ............. H01L 31/0749; H01L 21/02628; H01L 31/022425; H01L 21/02601; H01L 31/055
USPC ............ 257/435, 40, E33.001, E25.018
See application file for complete search history.

(56) References Cited

U.S. PATENT DOCUMENTS

| | | |
|---|---|---|
| 2010/0243046 A1 | 9/2010 | Degroot et al. |
| 2010/0273287 A1* | 10/2010 | Weiner et al. .......... 438/64 |
| 2010/0288359 A1 | 11/2010 | Xiong et al. |
| 2011/0139240 A1 | 6/2011 | Allenic et al. |
| 2011/0297216 A1 | 12/2011 | Ihn et al. |
| 2012/0000768 A1 | 1/2012 | O'Keefe |

OTHER PUBLICATIONS

International Search Report and Written Opinion, Application No. PCT/US2013/069848 dated Apr. 4, 2014.

* cited by examiner

*Primary Examiner* — Cathy N Lam
(74) *Attorney, Agent, or Firm* — MacMillan, Sobanski & Todd, LLC

(57) ABSTRACT

Thin film photovoltaic devices are provided. The device includes a transparent substrate; a transparent conductive oxide layer on the transparent substrate; an n-type window layer on the transparent conductive oxide layer, an absorber layer on the n-type window layer, and a back contact layer on the absorber layer. The n-type window layer includes a plurality of nanoparticles spatially distributed within a medium, with the nanoparticles comprising cadmium sulfide. In one embodiment, the medium has an optical bandgap that is greater than about 3.0 eV (e.g., includes a material other than cadmium sulfide). Methods are also provided for such thin film photovoltaic devices.

16 Claims, 2 Drawing Sheets

SPATIALLY DISTRIBUTED CDS IN THIN FILM PHOTOVOLTAIC DEVICES AND THEIR METHODS OF MANUFACTURE

FIELD OF THE INVENTION

The subject matter disclosed herein relates generally to a thin film layer having spatially distributed CdS nanoparticles. More particularly, the subject matter disclosed herein relates to a thin film layer having spatially distributed CdS nanoparticles for use as an n-type window layer in cadmium telluride thin film photovoltaic devices.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials. The junction of the n-type window layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type absorber layer (i.e., an electron accepting layer) and the CdS layer acts as a n-type window layer (i.e., an electron donating layer). Similarly, photovoltaic cells can be made that include copper indium gallium (di) selenide (CIGS) as the p-type layer.

However, CdS in the n-type window layer generally does not generate any current in a CdTe-based or CIGS-based solar cells due to its extremely short minority carrier lifetime. Since CdS (having an optical bandgap of about gap 2.42 eV) absorbs in the blue region of the spectrum, a thick layer of CdS lowers the current produced by the solar cell. As such, obtaining very high currents with a p-type layer of CdTe requires a relatively thin layer of CdS, which generally leads to low voltage. At the same time, a minimum thickness of CdS is needed to form a robust junction and generate high open circuit voltage. Accordingly, the CdS thickness is in balance.

Thus, a need exists for increasing solar cell efficiency by simultaneously attaining high voltage and high current through changing the dynamic of the n-type window layer.

BRIEF DESCRIPTION OF THE INVENTION

Aspects and advantages of the invention will be set forth in part in the following description, or may be obvious from the description, or may be learned through practice of the invention.

Thin film photovoltaic devices are generally provided. In one embodiment, the device includes a transparent substrate; a transparent conductive oxide layer on the transparent substrate; an n-type window layer on the transparent conductive oxide layer, an absorber layer on the n-type window layer, and a back contact layer on the absorber layer. The n-type window layer includes a plurality of nanoparticles spatially distributed within a medium, with the nanoparticles comprising cadmium sulfide. In one embodiment, the medium has an optical bandgap that is greater than about 3.0 eV (e.g., includes a material other than cadmium sulfide).

Methods are also generally provided for such thin film photovoltaic devices.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Figure 1:
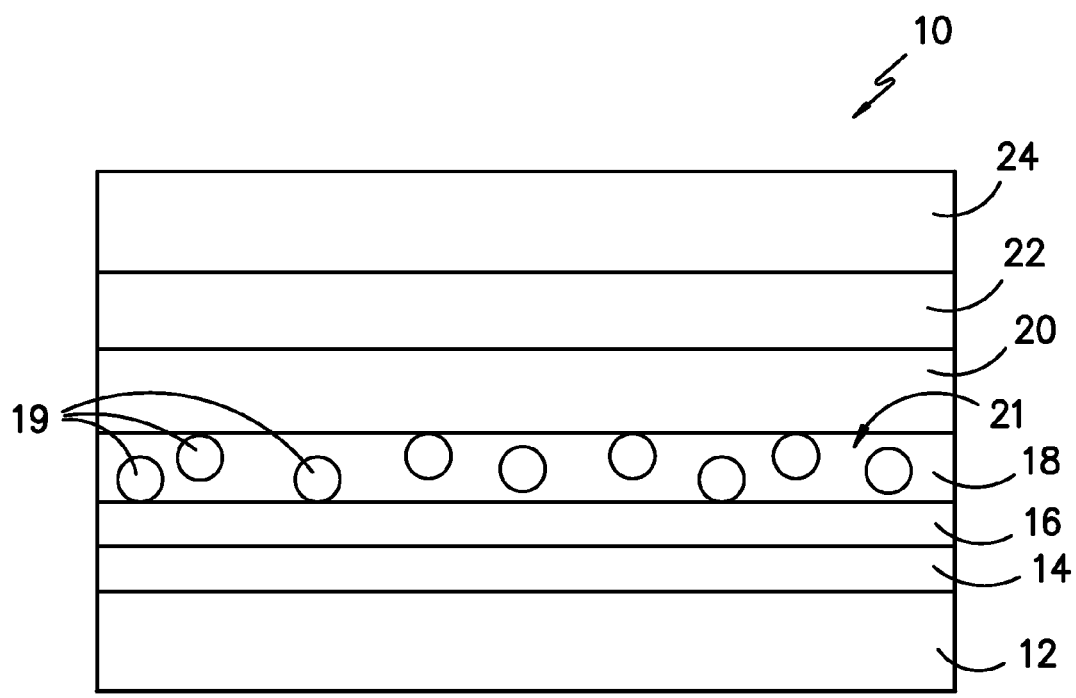
FIG. 1 shows a general schematic of a cross-sectional view of an exemplary cadmium telluride thin film photovoltaic device according to one embodiment of the present invention.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers, unless otherwise stated. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "μm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

Photovoltaic devices are generally provided having an n-type window layer that includes a plurality of nanoparticles of cadmium sulfide (CdS) that are spatially distributed within a transparent, electrically insulating medium, along with their methods of manufacture. Due to this configuration, a p-type absorber layer (e.g., including CdTe, CIGS, CZTS, etc.) can form a 3-dimensional junction with the CdS nanoparticles in the n-type window layer, such that it forms a vertical junction through the device in order to separate electron-hole pairs. As such, this configuration allows for higher voltage and higher current than a standard solar cell that has 2 dimensional symmetry (i.e., without nanoparticles of CdS).

The presently provided n-type window layer including the spatially distributed CdS nanoparticles can be utilized in the formation of any film stack that utilizes an n-type window layer of CdS. For example, the n-type window layer including the spatially distributed CdS nanoparticles can be used during the formation of any cadmium telluride (CdTe) device that utilizes a cadmium telluride layer, such as in the cadmium telluride thin film photovoltaic device disclosed in U.S. Publication No. 2009/0194165 of Murphy, et al. titled "Ultrahigh Current Density Cadmium Telluride Photovoltaic Modules."

Figure 2:
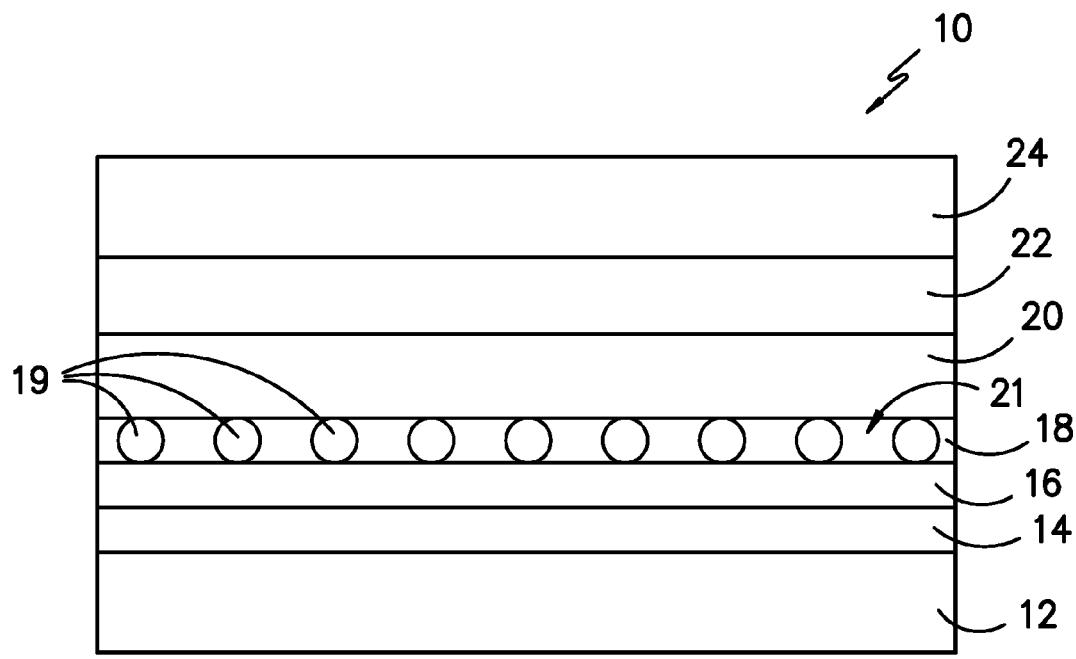
FIG. 2 shows a general schematic of a cross-sectional view of another exemplary cadmium telluride thin film photovoltaic device according to one embodiment of the present invention; and, FIG. 3 shows a general schematic of a cross-sectional view of yet another exemplary cadmium telluride thin film photovoltaic device according to one embodiment of the present invention.
Figure 3:
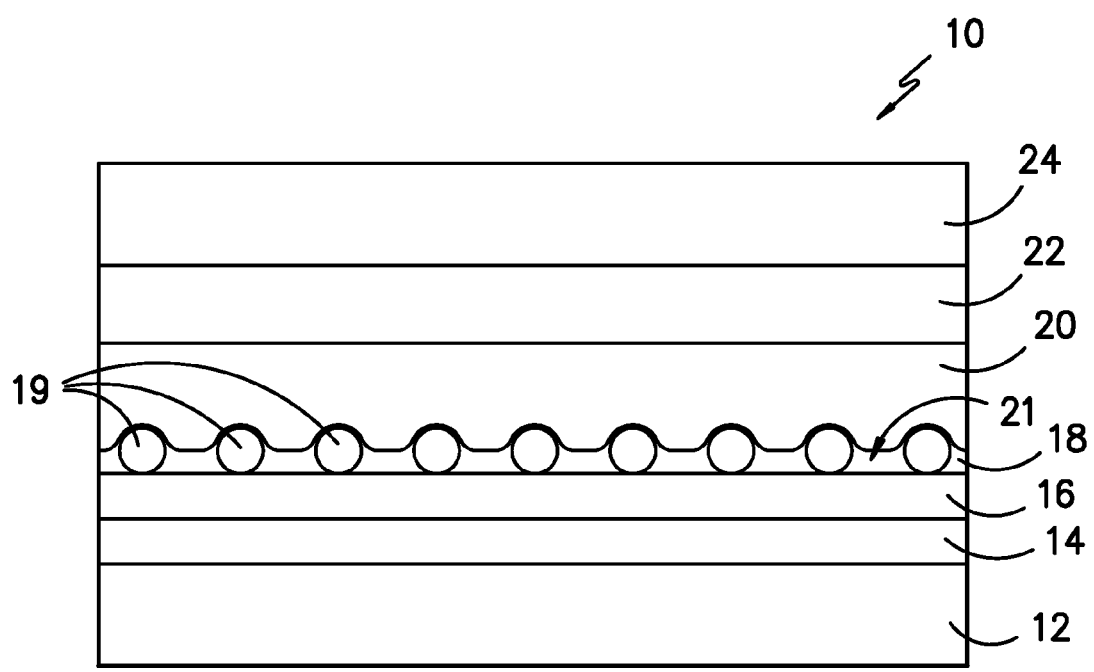

FIGS. 1-3 show cross-sections of exemplary thin-film photovoltaic device 10, according to various embodiments. The device 10 is shown including a transparent substrate 12 (e.g., a glass substrate), a transparent conductive oxide (TCO) layer 14, a resistive transparent buffer layer 16, an n-type window layer 18, a p-type absorber layer 20 (e.g., a cadmium telluride layer), a back contact layer(s) 22, and an encapsulation substrate 24. The n-type window layer 18 and the p-type absorber layer 20 generally form a p-n junction 19 in the device 10. Although discussed with respect to an absorber layer that includes CdTe, the presently described n-type window layer can be utilized with absorber layers made from other materials, such as copper indium gallium (di)selenide (CIGS) or copper zinc tin sulfide (CZTS).

As shown, the n-type window layer 18 includes a plurality of nanoparticles 19 spatially distributed within a medium 21. The nanoparticles 19, in one embodiment, have an average diameter of about 10 nm to about 100 nm, such as about 25 nm to about 90 nm.

The nanoparticles 19 generally include cadmium sulfide in an amount of at least 75% by weight, in most embodiments. For example, the nanoparticles 19 may include other materials, such as zinc sulfide, cadmium zinc sulfide, etc., and mixtures thereof as well as dopants and other impurities. In one particular embodiment, the nanoparticles 19 may include oxygen up to about 25% by atomic percentage in addition to CdS, for example from about 5% to about 20% by atomic percentage. In another embodiment, the nanoparticles 19 can consist essentially of cadmium sulfide, without substantially any other material present.

As stated, the plurality of nanoparticles 19 are spatially distributed within a medium 21. By "spatially distributed," it is meant that the nanoparticles 19 are randomly dispersed throughout the medium 21 to form the n-type window layer 18. In one embodiment, a majority of the nanoparticles 19 are spaced apart from the nearest adjacent nanoparticle(s) so as to not contact each other within the thickness of the medium 21. Thus, a spacing between adjacent nanoparticles 19 can be filled with the medium 21 to allow maximum transparency to light incoming into the device 10.

In one particular embodiment, the medium 21 is a transparent, electrically insulating medium, and generally includes a material other than cadmium sulfide. The medium can have, for instance, a resistivity of greater than about $10^4$ ohm-cm in order to insulate the p-n junction from the more conductive layers below. The medium has, in one embodiment, significantly more transparency than the CdS material, such as an optical band gap greater than about 3.0. eV (e.g., greater than about 3.3 eV), and a refractive index suitable for minimizing reflection losses. As such, the medium is substantially free from cadmium sulfide (except for the nanoparticles) in most embodiments.

For example, the medium 21 can include materials used for spin-on glass, such as the silicate, phosphosilicate, siloxane, or silsequioxane families, titanium alkoxides, as well as other families. Alternatively, the medium 21 can be primarily made of a transparent insulator, such as an inorganic oxide (e.g., silica, alumina, titania, hafnia, niobium oxide, ZnO, $SnO_2$, or a mixture thereof), an inorganic nitride (e.g., silicon nitride), or a mixture thereof. Other transparent insulators can include a transparent, highly resistive semiconductor (e.g., ZnS, ZnSe, or a mixture thereof).

The nanoparticles 19 can generally occupy about 5% to about 80% of the total volume defined by the n-type window layer 18, such as about 10% to about 75% of the total volume. As such, a sufficient amount of CdS can be present in the n-type window layer 18 to form the desired heterojunction with the material of the absorber layer and generate high open circuit voltage, while minimizing the amount of CdS present in the n-type window layer 18 for absorbing light in the blue region of the spectrum. Thus, the amount of light reaching the absorber layer 20 can be maximized while still providing a p-n heterojunction with CdS.

The thickness of the medium 21 of the n-type window layer 18 is, in one embodiment, about 20% to about 200% of the diameter of the nanoparticles 19. For example, the medium thickness (as measured in the z-direction between the RTB layer 16 and the absorber layer 20) can be about 30 nm to about 175 nm in most embodiments. Stated differently, the average diameter of the nanoparticles 19 can be less than, about the same as, or greater than the medium's thickness defined between the resistive transparent buffer layer 16 to the absorber layer 20 in the z-direction, as shown in FIGS. 1, 2, and 3, respectively.

FIG. 1 shows an exemplary embodiment where the medium 21 defines a medium thickness (extending between the resistive transparent buffer layer 16 to the absorber layer 20 in the z-direction) that is about 100% to about 200% of the average diameter of the nanoparticles 19 such that a majority of the nanoparticles 19 fail to span across the medium thickness.

Alternatively, FIGS. 2 and 3 show embodiments where a majority (or all) of the nanoparticles span across the medium thickness to directly contact both the resistive transparent buffer layer 16 and the absorber layer 20.

FIG. 2 shows an exemplary embodiment where the medium 21 defines a medium thickness (extending between the resistive transparent buffer layer 16 to the absorber layer 20 in the z-direction) that is about the same as the average diameter of the nanoparticles 19 such that a majority of the nanoparticles 19 span across the medium thickness to directly contact both the resistive transparent buffer layer 16 and the absorber layer 20.

FIG. 3 shows another exemplary embodiment where the medium 21 defines a medium thickness (extending between the resistive transparent buffer layer 16 to the absorber layer 20 in the z-direction) that is generally less than the average diameter of the nanoparticles 19 such that a majority of the nanoparticles 19 span across the medium thickness to directly contact both the resistive transparent buffer layer 16 and the absorber layer 20. Due to this difference in size, the nanoparticles 19 will extend farther than the medium 21 creating a rough surface (e.g., having peaks defined by the nanoparticles 19 and valleys defined by the medium 21 in the areas between adjacent nanoparticles 19). The deposition of the absorber layer 22 onto this rough surface can still be carried out and result in a substantially uniform absorber layer 22, since the thickness of the absorber layer 22 is greater than the surface roughness (i.e., the distance defined in the z-direction from the peaks and valleys).

The configurations of FIGS. 2 and 3 allow for the use of a more insulating medium for containing the nanoparticles, since a majority (or all) of the nanoparticles span across the medium thickness to directly contact both the resistive transparent buffer layer 16 and the absorber layer 20. For example, the medium thickness can be, in particular embodiments, about 20% to about 100% of the average diameter of the nanoparticles 19.

No matter the particular composition, the n-type window layer 18 can be formed on the transparent conductive oxide layer 14 (e.g., directly on the optional resistive transparent buffer layer 16) via any suitable process. For example, the n-type window layer 18 can be printed (e.g., flexographic or offset printing processes), sprayed, coated (e.g., roll, blade, Meyer rod, or air-knife coating processes), etc.

After coating, the film and medium is, in most embodiments, dried and cured via thermal treatment. The thermal treatment serves to remove organic contaminants remaining from the sol-gel process, as well as crystallize the medium. Suitable curing operations can take place between about 100° C. and 600° C. for about 5 to 60 minutes.

As stated, the exemplary devices 10 of FIGS. 1 and 2 include a transparent substrate 12 (e.g., a glass substrate) employed as a superstrate, as it is the substrate on which the subsequent layers are formed even though it faces upward to the radiation source (e.g., the sun) when the cadmium telluride thin film photovoltaic device 10 is in use.

The transparent substrate 12 can be, in one embodiment, a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the glass 12 can be a low iron float glass containing less than about 0.015% by weight iron (Fe), and may have a transmissivity of about 0.9 or greater in the spectrum of interest (e.g., wavelengths from about 300 nm to about 900 nm). In another embodiment, borosilicate glass may be utilized so as to better withstand high temperature processing. For example, a borosilicate glass can have a thickness of about 0.5 mm to about 2.5 mm.

The transparent conductive oxide (TCO) layer 14 is shown on the glass 12 of the exemplary device 10 of FIG. 1. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). In certain embodiments, the TCO layer 14 can have a thickness between about 0.1 μm and about 1 μm, for example from about 0.1 μm to about 0.5 μm, such as from about 0.25 μm to about 0.45 μm.

The TCO layer 14 generally includes at least one conductive oxide, such as tin oxide, zinc oxide, or indium tin oxide, or mixtures thereof. Additionally, the TCO layer 14 can include other conductive, transparent materials. For example, the TCO layer 14 can include zinc stannate and/or cadmium stannate, or a stoichiometric variation thereof.

The TCO layer 14 can be formed by sputtering, chemical vapor deposition, spray pyrolysis, or any other suitable deposition method. In one particular embodiment, the TCO layer 14 can be formed by sputtering, either DC sputtering or RF sputtering, on the glass 12. For example, a cadmium stannate layer can be formed by sputtering a hot-pressed target containing stoichiometric amounts of $SnO_2$ and CdO onto the glass 12 in a ratio of about 1 to about 2. The cadmium stannate can alternatively be prepared by using cadmium acetate and tin (II) chloride precursors by spray pyrolysis.

The resistive transparent buffer layer 16 (RTB layer) is shown on the TCO layer 14 on the exemplary cadmium telluride thin film photovoltaic device 10. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.0 eV).

Without wishing to be bound by a particular theory, it is believed that the presence of the RTB layer 16 between the TCO layer 14 and the n-type window layer 18 can allow for a relatively thin n-type window layer 18 to be included in the device 10 by reducing the possibility of interface defects (i.e., "pinholes" in the n-type window layer layer 18) creating shunts between the TCO layer 14 and the absorber layer 20. Thus, it is believed that the RTB layer 16 allows for improved adhesion and/or interaction between the TCO layer 14 and the cadmium telluride layer 22, thereby allowing a relatively thin n-type window layer 18 to be formed thereon without significant adverse effects that would otherwise result from such a relatively thin n-type window layer 18 formed directly on the TCO layer 14.

The RTB layer 16 can include, for instance, a combination of zinc oxide (ZnO) and tin oxide ($SnO_2$), which can be referred to as a zinc tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about an one to two (1:2) stoichiometric ratio of tin oxide to zinc oxide. The RTB layer 16 can be formed by sputtering, chemical vapor deposition, spraying pryolysis, or any other suitable deposition method. In one particular embodiment, the RTB layer 16 can be formed by sputtering, either DC sputtering or RF sputtering, on the TCO layer 14. For example, the RTB layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 16 can have a thickness between about 0.075 µm and about 1 µm, for example from about 0.1 µm to about 0.5 µm. In particular embodiments, the RTB layer 16 can have a thickness between about 0.08 µm and about 0.2 µm, for example from about 0.1 µm to about 0.15 µm.

As described in greater detail above, the n-type window layer 18 is shown on RTB layer 16 of the exemplary devices 10 of FIGS. 1 and 2.

An absorber layer 20 is shown on the n-type window layer 18 in the exemplary thin film photovoltaic device 10 of FIGS. 1 and 2. The absorber layer 20 is a p-type layer that interacts with the n-type window layer 18 to produce current from the absorption of radiation energy by absorbing the majority of the radiation energy passing into the device 10 due to its high absorption coefficient and creating electron-hole pairs. In one particular embodiment, the absorber layer can include cadmium telluride (i.e., a cadmium telluride layer); however, other materials can include, but are not limited to, (Ag,Cu)(In,Ga)(Se,S)$_2$, (Ag,Cu)ZnSn(Se,S), GaAs, amorphous Si, or other absorber materials.

For example, when the absorber layer 20 is formed from cadmium telluride, the resulting cadmium telluride layer 20 can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the p-type side (i.e., the cadmium telluride layer 20) across the junction to the n-type side (i.e., the n-type window layer 18) and, conversely, holes may pass from the n-type side to the p-type side. Thus, the p-n junction formed between the n-type window layer 18 and the absorber layer 20 forms a diode in which the charge imbalance leads to the creation of an electric field spanning the p-n junction. Conventional current is allowed to flow in only one direction and separates the light induced electron-hole pairs.

The absorber layer 20 can be formed by any known process, such as vapor transport deposition, chemical vapor deposition (CVD), spray pyrolysis, electro-deposition, sputtering, close-space sublimation (CSS), etc. In one particular embodiment, the absorber layer 20 is deposited by close-space sublimation. In particular embodiments, the absorber layer 20 can have a thickness between about 0.1 µm and about 10 µm, such as from about 1 µm and about 5 µm. In one particular embodiment, the absorber layer 20 can have a thickness between about 2 µm and about 4 µm, such as about 3 µm.

A series of post-forming treatments can be applied to the exposed surface of the absorber layer 20. These treatments can tailor the functionality of the absorber layer 20 and prepare its surface for subsequent adhesion to the back contact layer(s) 22. For example, when formed from cadmium telluride, the absorber layer 20 can be annealed at elevated temperatures (e.g., from about 350° C. to about 500° C., such as from about 375° C. to about 424° C.) for a sufficient time (e.g., from about 1 to about 10 minutes) to create a quality p-type layer of cadmium telluride. Without wishing to be bound by theory, it is believed that annealing the cadmium telluride layer 20 (and the device 10) converts the normally lightly p-type doped, or even n-type doped cadmium telluride layer 20 to a more strongly p-type cadmium telluride layer 20 having a relatively low resistivity. Additionally, the cadmium telluride layer 20 can recrystallize and undergo grain growth during annealing.

Annealing the cadmium telluride layer 20 can be carried out in the presence of cadmium chloride in order to dope the cadmium telluride layer 20 with chloride ions. For example, the cadmium telluride layer 20 can be washed with an aqueous solution containing cadmium chloride and then annealed at the elevated temperature.

In one particular embodiment, after annealing the cadmium telluride layer 20 in the presence of cadmium chloride, the surface can be washed to remove any cadmium oxide formed on the surface. This surface preparation can leave a Te-rich surface on the cadmium telluride layer 20 by removing oxides from the surface, such as CdO, $CdTeO_3$, $CdTe_2O_5$, etc. For instance, the surface can be washed with a suitable solvent (e.g., ethylenediamine also known as 1,2 diaminoethane or "DAE") to remove any cadmium oxide from the surface.

Additionally, copper can be added to the cadmium telluride layer 20. Along with a suitable etch, the addition of copper to the cadmium telluride layer 20 can form a surface of copper-telluride on the cadmium telluride layer 20 in order to obtain a low-resistance electrical contact between the cadmium telluride layer 20 (i.e., the p-type layer) and the back contact layer(s). Specifically, the addition of copper can create a surface layer of cuprous telluride ($Cu_2Te$) between the cadmium telluride layer 20 and the back contact layer 22. Thus, the Te-rich surface of the cadmium telluride layer 20 can enhance the collection of current created by the device through lower resistivity between the cadmium telluride layer 20 and the back contact layer 22.

Copper can be applied to the exposed surface of the cadmium telluride layer 20 by any process. For example, copper can be sprayed or washed on the surface of the cadmium telluride layer 20 in a solution with a suitable solvent (e.g., methanol, water, or the like, or combinations thereof) followed by annealing. In particular embodiments, the copper may be supplied in the solution in the form of copper chloride, copper iodide, or copper acetate. The annealing temperature is sufficient to allow diffusion of the copper ions into the cadmium telluride layer 20, such as from about 125° C. to about 300° C. (e.g. from about 150° C. to about 200° C.) for about 5 minutes to about 30 minutes, such as from about 10 to about 25 minutes.

A back contact layer 22 is shown on the cadmium telluride layer 20. The back contact layer 22 generally serves as the back electrical contact, in relation to the opposite, TCO layer 14 serving as the front electrical contact. The back contact layer 22 can be formed on, and in one embodiment is in direct contact with, the cadmium telluride layer 20. The back contact layer 22 is suitably made from one or more highly conductive materials, such as elemental nickel, chromium, copper, tin, aluminum, gold, silver, technetium or alloys or mixtures thereof. Additionally, the back contact layer 22 can be a single layer or can be a plurality of layers. In one particular embodiment, the back contact layer 22 can include graphite, such as a layer of carbon deposited on the p-layer followed by one or more layers of metal, such as the metals described above. The back contact layer 22, if made of or comprising one or more metals, is suitably applied by a technique such as sputtering or metal evaporation. If it is made from a graphite and polymer blend, or from a carbon paste, the blend or paste is applied to the semiconductor device by any suitable method for spreading the blend or paste, such as screen printing, spraying or by a "doctor" blade. After the application of the graphite blend or carbon paste, the device can be heated to convert the blend or paste into the conductive back contact layer. A carbon layer, if used, can be from about 0.1 µm to about 10 µm in thickness, for example from about 1 µm to about 5 µm. A metal layer of the back contact, if used for or as part of the back contact layer 22, can be from about 0.1 µm to about 1.5 µm in thickness.

The encapsulating glass 24 is also shown in the exemplary cadmium telluride thin film photovoltaic device 10 of FIG. 1.

Other components (not shown) can be included in the exemplary device 10, such as bus bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects. In one particular embodiment, for instance, a laser can be used to scribe the deposited layers of the semiconductor device to divide the device into a plurality of series connected cells.

Although not specifically shown in FIG. 1, other thin film layers may also be present in the thin film stack. For example, index matching layers can be positioned between the transparent conductive oxide layer 14 and the transparent substrate 12. Additionally, an oxygen getter layer (e.g., comprising alumina) can be positioned between the transparent conductive oxide layer 14 and the resistive transparent buffer layer 16.

Methods are also generally provided for forming the device 10. For example, the n-type window layer can be formed (e.g., via printing, coating, etc.) over the transparent conductive oxide layer of a transparent substrate (e.g., directly onto a resistive transparent layer that is positioned on the transparent conductive oxide layer) such that the n-type window layer includes a plurality of nanoparticles spatially distributed within a medium. An absorber layer can then be formed over the n-type window layer.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:
1. A thin film photovoltaic device, comprising:
a transparent substrate;
a transparent conductive oxide layer on the transparent substrate;
an n-type window layer on the transparent conductive oxide layer, wherein the n-type window layer comprises a plurality of nanoparticles spatially distributed within a medium, wherein the medium is substantially free of cadmium sulfide except for the nanoparticles which comprise cadmium sulfide, and wherein the medium has an optical bandgap that is greater than about 3.0 eV;
an absorber layer on the n-type window layer; and,
a back contact layer on the absorber layer.

2. The device of claim 1, wherein the medium is a transparent, electrically insulating medium.

3. The device of claim 2, wherein the medium has a resistivity of greater than about $10^4$ Ohm-cm.

4. The device of claim 1, wherein the medium comprises an inorganic oxide, an inorganic nitride, or a mixture thereof.

5. The device of claim 1, wherein the medium comprises $SiO_2$, $TiO_2$, or a mixture thereof.

6. The device of claim 1, wherein the medium has an optical bandgap that is greater than about 3.3 eV.

7. The device of claim 1, wherein the nanoparticles have an average diameter of about 10 nm to about 100 nm.

8. The device of claim 7, wherein the medium defines a medium thickness between the transparent conductive oxide layer and the absorber layer, and wherein the medium thickness is about 20% to about 200% of the average diameter of the nanoparticles.

9. The device of claim 7, wherein the medium thickness is about 50 nm to about 175 nm.

10. The device of claim 7, wherein the n-type window layer defines a total volume between the transparent conductive oxide layer and the absorber layer, and wherein the nanoparticles constitute about 5% to about 80% of the volume of the n-type window layer.

11. The device of claim 1, wherein the nanoparticles consist essentially of cadmium sulfide.

12. The device of claim 1, wherein the absorber layer comprises cadmium telluride.

13. The device of claim 1, wherein the transparent conductive oxide layer comprises cadmium, tin, and oxygen.

14. The device of claim 1, further comprising:
a resistive transparent buffer layer positioned between the transparent conductive oxide layer and the n-type window layer.

15. The device of claim 14, wherein the medium defines a medium thickness extending between the resistive transparent buffer layer and the absorber layer, and wherein the medium thickness is about 20% to about 100% of the average diameter of the nanoparticles such that a majority of the nanoparticles span across the medium thickness to directly contact both the resistive transparent buffer layer and the absorber layer.

16. The device of claim 14, wherein the medium defines a medium thickness extending between the resistive transparent buffer layer and the absorber layer, and wherein the medium thickness is about 100% to about 200% of the average diameter of the nanoparticles such that a majority of the nanoparticles fail to span across the medium thickness.

* * * * *